United States Patent [19]

Yu

[11] Patent Number: 5,303,187

[45] Date of Patent: Apr. 12, 1994

[54] NON-VOLATILE SEMICONDUCTOR MEMORY CELL

[76] Inventor: Shih-Chiang Yu, 10451 Davison Ave., Cupertino, Calif. 95014

[21] Appl. No.: 997,236

[22] Filed: Dec. 28, 1992

[51] Int. Cl.$^5$ .................. H01L 29/68; G11C 11/34
[52] U.S. Cl. ..................... 365/185; 365/182; 257/314; 257/365; 257/528
[58] Field of Search ................... 365/185, 182

[56] References Cited

U.S. PATENT DOCUMENTS

| | | | |
|---|---|---|---|
| 4,783,766 | 11/1988 | Samachisa et al. | 365/900 |
| 5,057,886 | 10/1991 | Riemenschneider et al. | 365/185 |
| 5,194,925 | 3/1993 | Ajika et al. | 365/185 |

FOREIGN PATENT DOCUMENTS

2073488 10/1981 Japan.

Primary Examiner—Eugene R. LaRoche
Assistant Examiner—Viet Q. Nguyen
Attorney, Agent, or Firm—Kam T. Tam

[57] ABSTRACT

A non-volatile semiconductor memory cell comprises a P-type semiconductor substrate (5) and N+ diffusion regions (6) spaced apart from each other on the principal surface of a P-type substrate (5). Each N+ diffusion region (6) can be used as source or drain of a transistor. Between any two adjacent N+ diffusion regions and under the gates is located the channel region (7). A control Y gate (8) is formed on an insulation layer above a portion of the channel and extends over a portion of N+ diffusion region (6). A floating gate (9) is formed on an insulation layer above the control Y gate (8) and the rest of the channel, and extends over a portion of another N+ diffusion region (6). A control X gate (10) is formed on an insulation layer above the floating gate (9) and N+ diffusion regions (6). Isolation between N+ diffusions (6), not covered by the control X gate (10), is provided by P+ diffusion regions (11) diffused into the substrate between each cell and its adjacent cells, or by oxide filled trench, or by relatively thick field oxide. The resulting structures are reliable contactless EPROM's or EEPROM's.

9 Claims, 6 Drawing Sheets

NON-VOLATILE SEMICONDUCTOR MEMORY CELL

BACKGROUND OF THE INVENTION

1. Field of the Invention

The present invention relates to semiconductor memories, and, in particular, to non-volatile, Erasable Programmable Read-Only Memory (EPROM), and Electrically Erasable and Programmable Read-Only Memory (EEPROM).

2. Prior Art

Metal Oxide Semiconductor (MOS) semiconductor memory devices, in particular, floating gate MOS transistor structures used as memory cells, are well-known in the art. In general, such devices operate by charging or discharging a floating gate, which floating gate then affects whether the device will easily conduct or will not easily conduct current from drain to source of the MOS transistor. The status of the floating gate as either electrically charged or discharged, which controls the conductance of the channel of the MOS device so that the device can be tested to identify a storage state, makes the device useful in the same fashion as other bi-stable data storage devices such as magnetic cores, flip-flops, and so forth. Memory arrays made of such devices are programmed to one state or the other depending upon the memory storage requirement for each particular cell. By choosing an appropriate convention for an EEPROM, a "0", for example, may be represented as the presence of conduction or, at least relatively high conduction through a cell, and a "1" as the absence of conduction, or relatively low conduction, through a cell, or vice-a-versa.

In EEPROM devices, two mechanisms are generally used for electrically charging or discharging the floating gate: Fowler-Nordheim tunneling and channel hot-electron injection. By Fowler-Nordheim tunneling, the floating gate is charged or discharged by use of a relatively high potential across a thin dielectric layer such as silicon dioxide, causing tunneling of electrons onto or out of the floating gate.

By applying suitable voltages to the gate, drain and source, channel hot electron injection can be made to occur when the channel is near pinch-off, causing an increase in the number of "hot" or high energy electrons, some of which have sufficient energy to transit the insulation layer barrier which separates the channel, from the floating gate. Charges on the floating gate remain after the programming conditions are removed due to the insulation layer such as silicon dioxide which surrounds it.

To make a useful device from the single memory cell which has been described, a plurality of such cells is arranged into rows and columns, groups of drains of memory cells generally being connected by lines called a "bitlines" and groups of gates of memory cells being connected by lines called "wordlines". Each individual cell within the array can be addressed, and its contents can be read-out, by applying appropriate signals to the selected bitline and wordline associated with that particular cell. When so addressed, the existence of charge (or its absence) on the floating gate is determined by interrogating the cell individually and sensing whether it is conductive or non-conductive between the source and the drain. In practical arrays, the individual bits are not read out singly, but are rather read out as bytes: groups of eight related bits.

The geometry of a conventional EPROM cell comprises a channel disposed between drain and source. Overlying the channel and isolated from it by a thin insulating layer is a floating gate. The floating gate is sandwiched between the channel and a select gate and isolated from them by insulating layers. A contact on the drain provides for connection to the bit-line. A wordline extends to each cell. A source line is common to a group of cells. Adjacent cells are isolated by thick field oxide. Such a cell requires space for the contact and the thick field oxide regions which occupy substantial, expensive "real estate" on the silicon substrate.

Recently, EPROM/EEPROM cells which do not require field oxide and contacts were reported. (See, for example, R. Kazerounian, et al.; IEDM Technical Digest Papers, paper 11.5.1, pp 311–314, (1991) or B. J. Woo, et al.; IEDM Technical Digest Papers, paper 5.1.1, pp 91–94, (1990). or Yoshimitsu Yamauchi:, et al; IEDM91, pp 319 to 322.)

Gill, U.S. Pat. No. 5,051,796, issued Sep. 24, 1991, describes buried bitline construction of memory arrays.

Such buried bitlines offer many improvements in construction over the earlier structures, and can provide a theoretically higher density than cells having contacts, in that the area occupied by the cell is reduced by the absence of the metallic contact. However, the buried bitline has high capacitance and, in particular, causes high drain-to-gate capacitance. This causes a reduction in the immunity of the cells to spurious signals which frequently occur during programming.

As memory storage size demands increase, the demands for miniaturization of each individual cell increase correspondingly, the goal being ever-expanding capacity in ever-decreasing physical size, while the cost per bit remains steady or, preferably, decreases. To increase the chip density, the individual cell size must be decreased through various methods such as eliminating contacts, replacing field oxide isolation by junction isolation, and the like. To further reduce cell size, the capacitance coupling ratio of the floating gate to the control gate must be increased, and the control and select methods must be made more reliable.

SUMMARY OF THE INVENTION

Accordingly, it is an object of the present invention to provide a non-volatile semiconductor memory cell having improved size and density capability and high reliability through improved immunity to spurious signal during programming.

it is a further objective of the present invention to provide an improved non-volatile semiconductor memory cell having improved gate capacitance coupling ratio.

These and other objects of the present invention are accomplished by providing an improved design of a non-volatile semiconductor memory cell which has an improved cell structure.

In general terms, the device geometry is comprised of a semiconductor substrate of a first conduction type (P-type substrate), and two regions of a second conduction type (N-type) different from the first conduction type, which are separate from one another, formed on a principal surface of the substrate. Each of the second conduction type (N-type) regions can be used either as a source or as a drain of a transistor, depending upon the voltages applied to the regions.

In between any two adjacent second conduction type (N-type) regions is an associated channel region. A control gate, denominated the "control Y gate", is formed over an insulating dielectric layer on the principal surface of the substrate above a portion of the channel region and a portion of one of the second conduction type (N-type) regions. For explanation purposes, the region closest to the control Y gate is denominated a "source". The other conduction region is defined as a "drain". A floating gate is formed on an insulation layer above the control Y gate and the remainder of the channel that is not covered by the control Y gate, and extends over a portion of the other second conduction type (N-type) region. Another control gate, denominated "control X gate", is formed on an insulation layer above the floating gate and the second conduction type regions. Isolation between the source and drain regions not covered by the control X and Y gates, is accomplished by implanting ions of the first conduction type (P-type) to form a junction, or by relatively thick oxide isolation, or by oxide filled trench isolation.

The cell structure described has the following desirable characteristics: the gate capacitance coupling ratio is increased dramatically; memory cells are isolated from bit-line high voltage disturbances during programming because the control Y gates of unselected cells are at ground voltage; the cell array can be programmed or erased down to a single bit or byte level, rather than being limited to block level programming or erasure; the diffusion bit-line can be extended wider whenever voltage is applied to the control Y gate, so that the diffusion bit-line resistance is greatly reduced. These multiple attributes are the direct result of the unique cell geometry of the present invention.

The above, the other, features and advantages of the present invention will be set forth more completely in the description of the preferred embodiment, including the following drawings.

BRIEF DESCRIPTION OF THE DRAWINGS

FIG. 6b is a cross-sectional view taken along line 6b—6b of FIG. 6a.

FIG. 6c is a cross-sectional view taken along line 6c—6c of FIG. 6a.

FIG. 7a is a cross-sectional view taken along line 7b—7b of FIG. 7a.

FIG. 7c is a cross-sectional view taken along line 7c—7c of FIG. 7a.

DESCRIPTION OF THE PREFERRED EMBODIMENT

Figure 1:
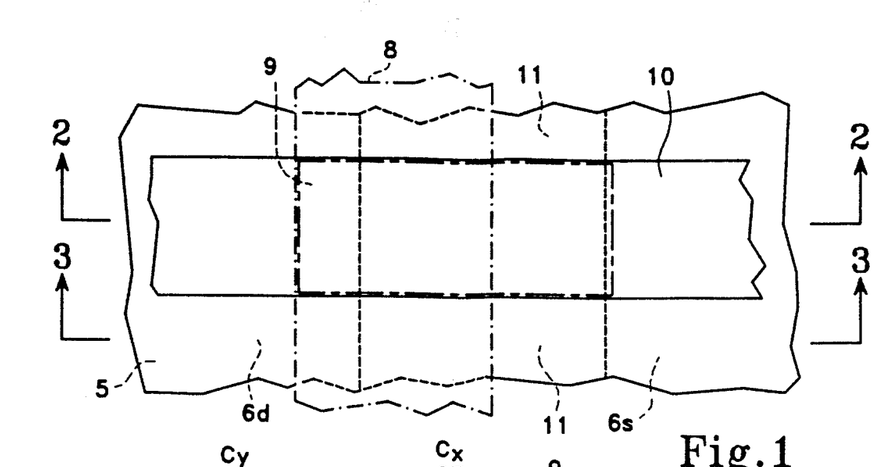
FIG. 1 is a top plan view of a non-volatile memory cell in accordance with the preferred embodiment of present invention.
Figure 2:
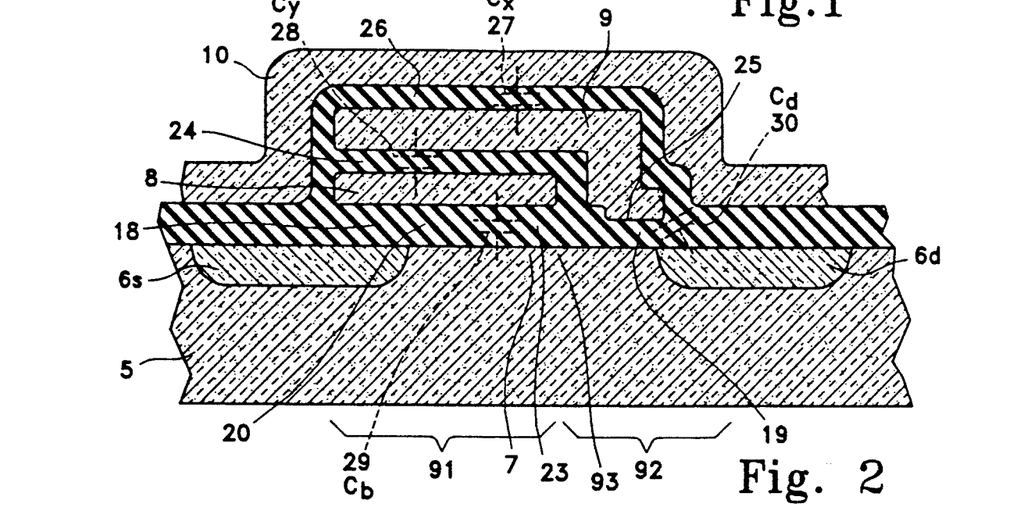
FIG. 2 is a cross-sectional view taken along line 3—3 of FIG. 1.
Figure 3:
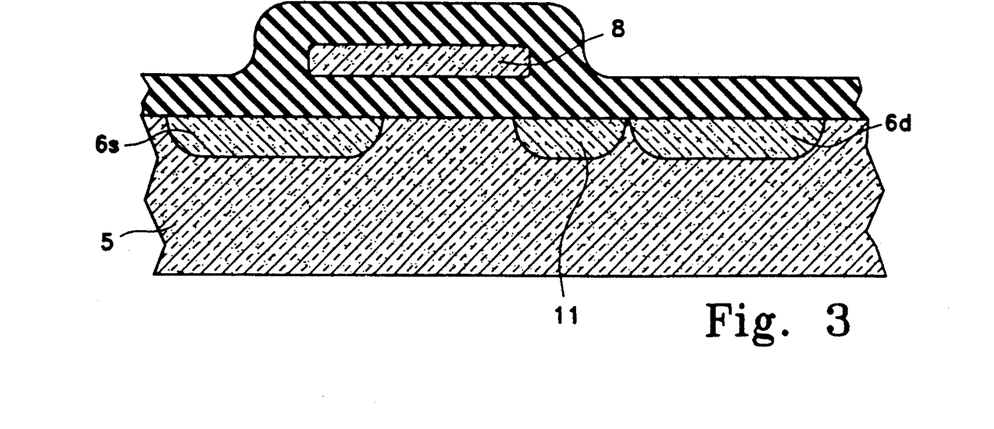
FIG. 3 is a cross-sectional view along line 3—3 of FIG. 1.
Figure 6A:
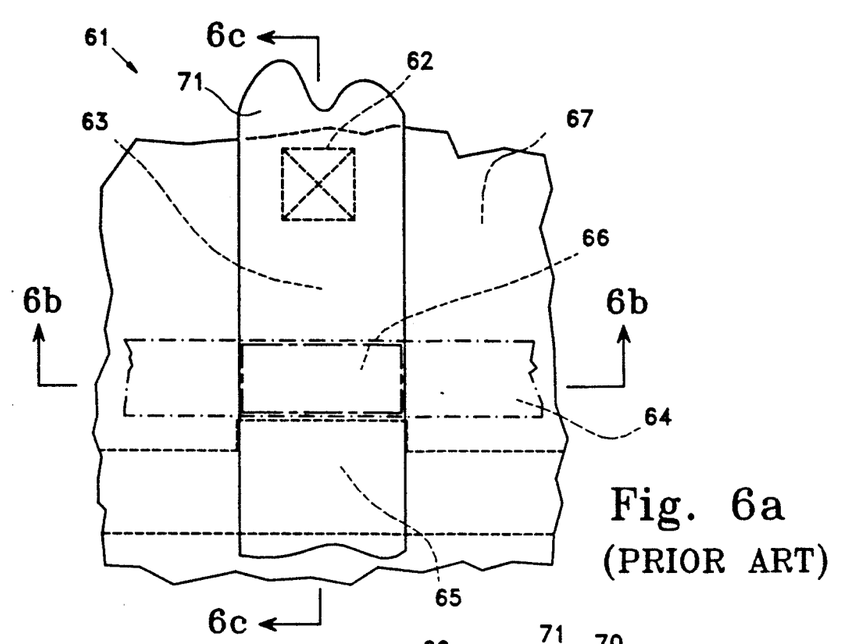
FIG. 6a is a top plan view of a non-volatile memory cell used in prior art EPROM/EEPROM device.
Figure 6B:
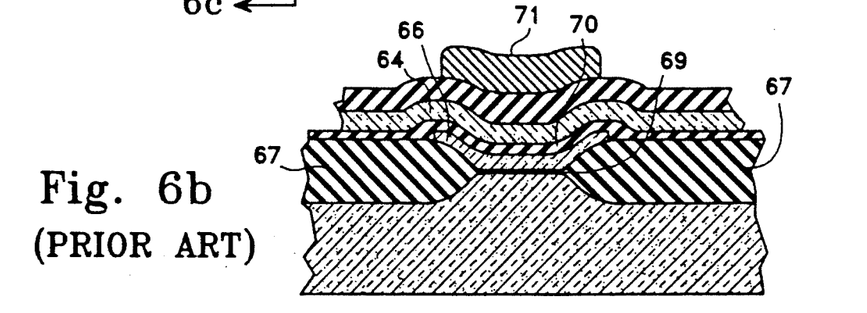
Figure 6C:
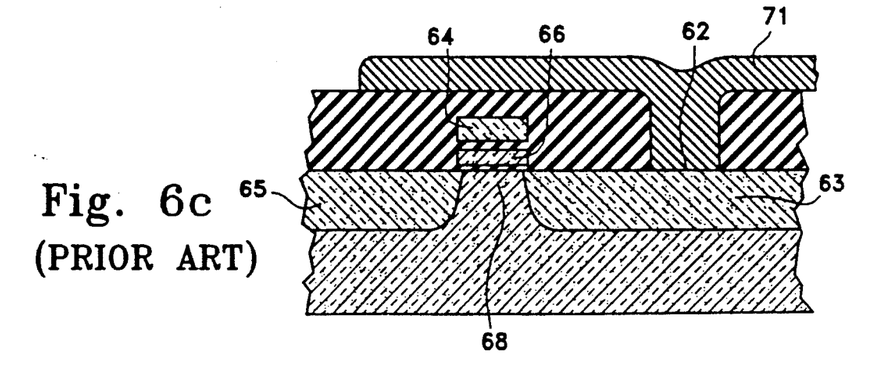

In FIGS. 1, 2 and 3, the geometry of a memory cell in accordance with the preferred embodiment the present invention is shown. The structure and function of the cells is best understood by first referring to the structure of the prior art EPROM/EEPROM cells, an example of which is shown in FIG. 6. The various regions of both of the cells are formed in a manner which is well-known in the art. However, due to the new geometry of the present device, a memory array of greater density, and more programming flexibility than the prior art devices is possible.

Prior Art EPROM/EEPROM Cell

Considering first, for comparison, the conventional EPROM/EEPROM cell, the geometry of such a cell 61 is shown in FIGS. 6a, 6b and 6c. In the figures, a channel 68 is disposed between drain 63 and source 65. Overlaying the channel, but isolated from it by a thin insulating layer 69 is a floating gate 66. Above the floating gate 66, and similarly isolated from it by an insulating layer 66, is a select gate 64. Metallic contact 62 on the drain 63 provides for connection to a "bitline". A wordline 64 extends to each cell. Field oxide 67 is used to isolate one cell from another. When appropriate signals are applied to the wordline 64 and bitline 71 connected to contact 62 of the cell, current flow can occur between drain 63 and source 65, provided the floating gate 66 is not charged with an excess of electrons.

Such a cell works well, but is not optimally small because of the need for the metallic contact 62 and thick field oxide 67 which is used for isolation.

EPROM/EEPROM Cell of Present Invention

The geometry of the EEPROM memory cell of the present invention is shown in FIG. 1. FIGS. 2 and 3 are cross-sectional views taken along line 2—2 and line 3—3, respectively, of FIG. 1.

Each individual cell which may be used to make up an array; comprises two N+ diffusion regions source-drain 6, a control X gate 10, a floating gate 9 and a control Y gate 8. As shown in FIG. 1, control X gate 10 and control Y gate 8 are generally elongated in shape and are disposed on the top of semiconductor substrate 5 generally perpendicular to each other.

Any given N+ region along a bitline may serve at one time as the source of one line of transistors and at another time as the drain of adjacent transistors, hence the term "source-drain". In FIGS. 1, 2 and 3, source-drain 6s is denominated the "source" while source-drain 6d is denominated the "drain" on any given cell under consideration. However, the function of the source-drain 6 depends upon the voltages applied to the individual cell.

The cell is constructed on a semiconductor substrate 5, typically a P-type silicon substrate if the cell is to be a N-channel device. The N+ diffusion regions 6s and 6d are heavily doped to provide conductance. Between the N+ regions 6s and 6d is the channel region 7. Constructed in an array, the N+ regions are preferably linear and parallel to one another. Moreover, all source-drains placed on a given line, are connected to one another and form the bitlines of each cell of the array. Since the P− substrate also occupies the area between cells, it creates, if uncorrected, an unwanted channel between the source 6s of one cell and the drain 6d of another cell which is adjacent to the first cell on the same bitline. Conduction could occur between cells through this unwanted channel when the cell elements are at certain potentials. To prevent such unwanted conduction, adjacent cells are isolated from one another by a P+ isolation region 11 which is formed between adjacent cells in the region next to the drain, as is described below and shown in FIG. 3 which is a cross-sectional view taken along line 3—3 of FIG. 1. Cell to cell isolations are also shown in FIG. 7c which is the cross-sectional view taken along line 7c—7c of FIG. 7a.

Disposed between the source 6s and drain 6d is the channel 7. The control Y gate 8, the floating gate 9, and the control X gate 10 are dielectrically separated from and formed over the surface of the substrate, overlapping the source 6s, the drain 6d and the channel 7 as described in detail in the process stages below. Each gate is dielectrical separated from the other and from the source 6s and drain 6d by insulating layers, such as silicon dioxide films. The insulating film between floating gate 9 and channel 7 is the thinner tunneling region 19 in the vicinity of the drain side of the channel. Although the N+-type regions are denominated "source-drain", for any given cell the function as source or drain is clear. For the cell under consideration, the drain 6d is the N+ region adjacent to the tunneling region 19 of the first dielectric layer 20. That same N+-type region, when considered as a part of the next cell of the array functions as the source 6s for that cell.

The floating gate 9 extends at least partially over the control Y gate 8 and the channel 7, and at least partially over the drain 6d, and may have a tunneling area 25 which extends into the tunneling region 19 of the oxide layer 20.

First insulating layer 18 includes a tunneling region 19 which has a thinner thickness. First insulating layer 18 can be an oxide film. A second insulating layer 24, an oxide film in this case, typically covers the control Y gate 8. A third insulating layer 26, also an oxide film in this case, covers the floating gate 9.

The insulating films formed between each of the gates 8, 9, and 10 and the silicon substrate have a thickness of, for example, about 500 angstroms. The thickness of the thin tunneling region 19 is, for example, about 100 angstroms.

The capacitances between the elements of the cell are of paramount importance. If the capacitance ratios are unfavorable, the cell will be difficult to program and susceptible to disturbances. However, if the capacitance ratios are favorable, these effects are ameliorated.

In FIG. 2, the capacitances are depicted as lumped constant elements, although it will be appreciated that they are actually distributed constants. They are labeled in accordance with the following conventions:

Capacitor $C_x$ 27 is the capacitance of the floating gate 9 of the cell with respect to the control X gate 10.

Capacitor $C_y$ 28 is the capacitance of the floating gate 9 of the cell with respect to the control Y gate 8.

Capacitor $C_b$ 29 is the capacitance of the floating gate 9 of the cell with respect to the substrate 5.

Capacitor $C_d$ 30 is the capacitance of the floating gate 9 of the cell with respect to the drain 6d.

For these distributed capacitances, the relative effect of each can be described in terms of capacitance ratios $K_x$, $K_y$, $K_b$ and $K_d$ respectively.

Capacitance ratio $K_x$ for $C_x$ is:
$$K_x = \frac{C_x}{C_x + C_y + C_b + C_d}$$

Capacitance ratio $K_y$ for $C_y$ is:
$$K_y = \frac{C_y}{C_x + C_y + C_b + C_d}$$

Capacitance ratio $K_b$ for $C_b$ is:
$$K_b = \frac{C_b}{C_x + C_y + C_b + C_d}$$

Capacitance ratio $K_d$ for $C_d$ is:
$$K_d = \frac{C_d}{C_x + C_y + C_b + C_d}$$

These ratios have an effect on the voltage $V_f$ to which the floating gate 9 is driven in the absence of hot-electron or Fowler-Nordheim Tunneling current flow as follows:

$$V_f = K_x V_x + K_y V_y + K_b V_b + K_d V_d$$

where $V_x$, $V_y$, $V_b$, $V_d$ are the voltages applied to control X gate, control Y gate, substrate and the drain of this cell respectively.

From comparing the equation to the figures, it can be seen that the terms relating to $C_y$ are absent from a conventional cell. Consequently, the memory cell of the present invention is improved by the amount of the $C_y$ terms.

It is desired for maximum capacitance coupling that the $K_x$ ratio and the $K_y$ ratio be large and that the $K_b$ and $K_d$ ratios be small.

Conduction between the drain 6d and source 6s through the channel 7 is controlled by the status of the gates 8, 9 and 10. Although the cell is described herein as conducting or non-conducting, it will be appreciated by those skilled in the art that even when "non-conducting" some current flow through the cell occurs, and that when "conducting" some resistance to conduction exits in the channel. Discrimination between the two conditions of being programmed or erased therefore is a matter of relative conduction values, not a matter of absolute presence or absence of conduction.

Figure 9:
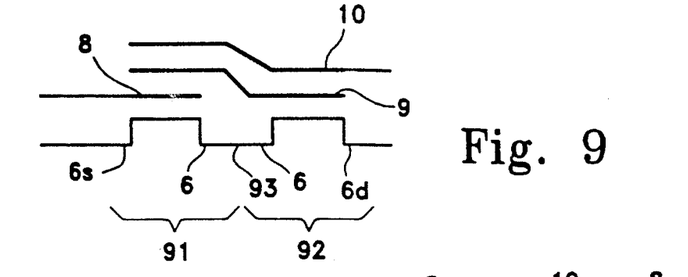
FIG. 9, is a schematic depiction of the equivalent circuit of a memory cell in accordance with the preferred embodiment of the present invention.

Referring now to FIG. 9, a schematic depiction of the cell shows how, in effect, the device functions as two series transistors. In the figure, the cell has been functionally divided into two transistors, 91 and 92. The same partition is also shown in FIG. 2 with parenthesis. The first equivalent transistor 91 is comprised of the source-drain 6s, which functions as the source, the source-drain 6d, which functions as a drain, the floating gate 9, and the control Y gate 8. The first equivalent transistor 91 is primarily controlled by control Y gate 8. The second equivalent transistor 92 is comprised of the source-drain 6s, which functions as the source, the source-drain 6d, which functions as a drain, and the floating gate 9. The second equivalent transistor is primarily controlled by control X gate 10 and floating gate 9. The interconnect point 93 between the two transistors 91 and 92 physically resides in channel 7 shown in FIG. 2 and is included in the figure for the sake of illustration.

Since the equivalent circuit depicts two transistors in series, control Y gate 8 can cause a blockage of conduction through the channel, regardless of the status of the floating gate 9.

Of course, if the cell is programmed by negatively charging the floating gate 9, then the effect of the control X gates 10 is obscured by the charge on the floating gate 9 itself. That is to say, the floating gate charge will cause the cell to appear to be non-conducting even when the control Y gate 8 and control X gate 10 enable the cell for read-out. If the cell is erased, the cell will be conducting when control Y gate 8 and control X gate 10 enable the cell for read-out.

Array Schematic

To be useful as a practical device, the single cell memory elements must be organized into an array having the capability of being programmed. Typically, the array is organized into a matrix rows and columns.

Figure 4:
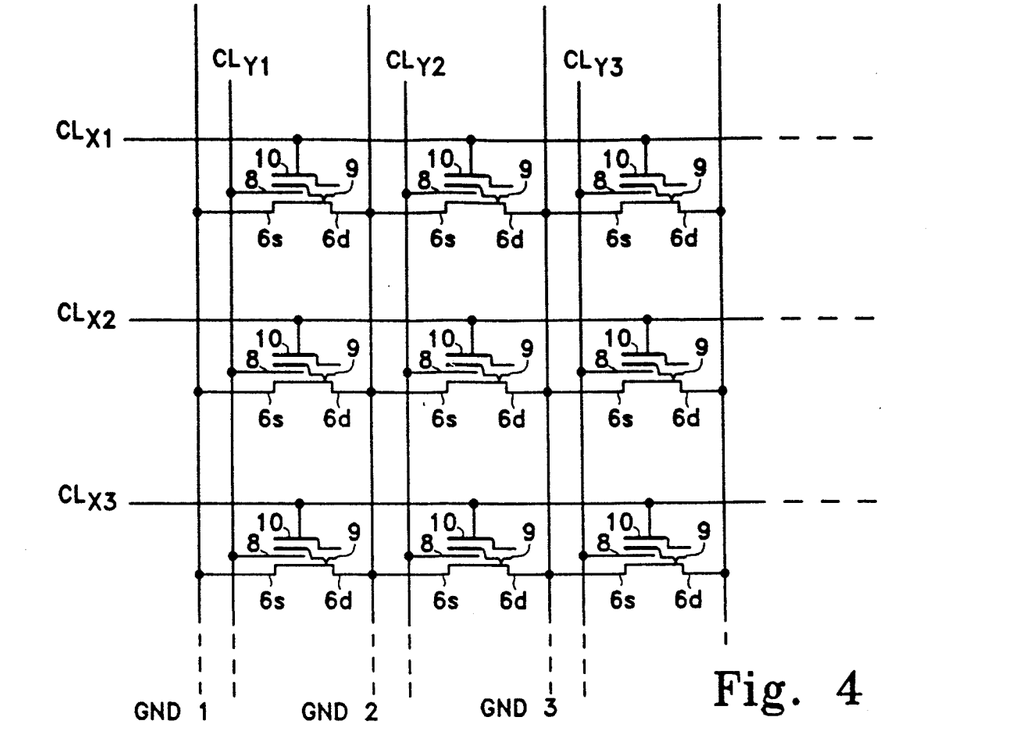
FIG. 4 is a schematic diagram showing the arrangement of the memory cells in accordance with the preferred embodiment of the present invention within an array.

The electrical diagram of such an array is shown in FIG. 4. Although only nine complete cells are shown by way of illustration, it will be appreciated that the number of cells may be increased substantially.

The advantages of the new cell technology are illustrated by the array. Control lines $CL_x$ apply control potentials to control X gates 10 while control lines $CL_y$ apply control potentials to the control Y gate 8. As discussed above, the cell which is selected by the intersection of the control lines will conduct or not conduct indicating whether the floating gate 9 is not charged or charged, and therefore whether the cell is erased or programmed.

To read out any cell, moderate voltages, specifically voltages below the programming potentials, are applied to control Y gates 8 and control X gate 10 through control lines $CL_y$ and $CL_x$, respectively. If the cell is to be erased, i.e., programmed for conduction, modest potentials on the bitlines, for example +2 volts, will cause a current to flow in the cell so addressed. If the cell is programmed to not conduct, then no current, or at least a relatively low current, will flow. By appropriate programming of all of the cells, the desired digital storage pattern is established in the array.

Operating Potentials

Figure 5:
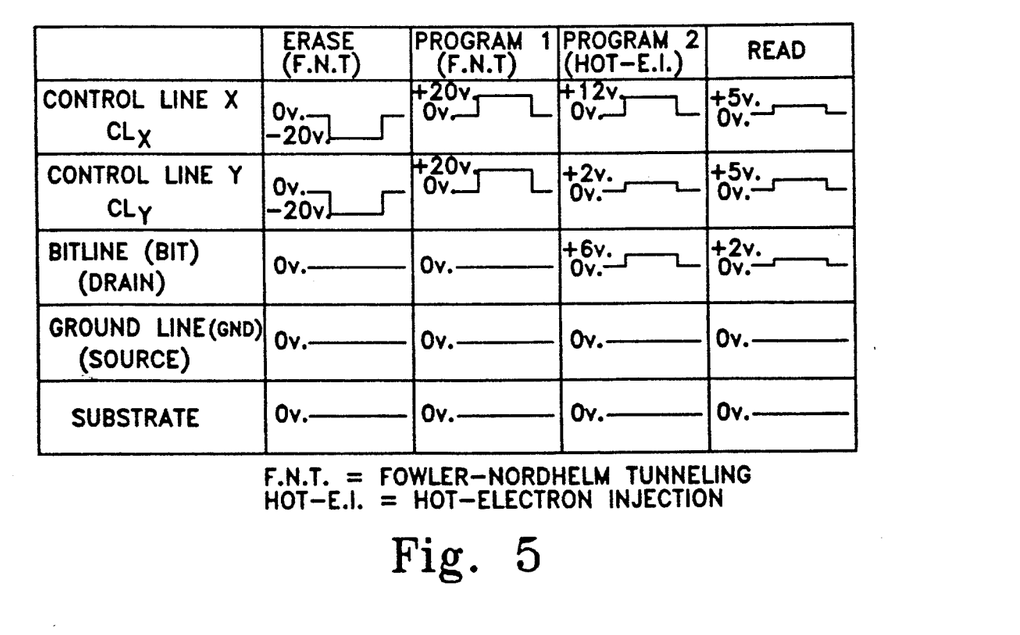
FIG. 5 is a table illustrating the particular voltage which would appear at the various elements of a memory cell or array of cells in accordance with the present invention during the various operations.

The applied potentials for erasing, and programming information into, and reading information out of a cell are described in FIG. 5.

Fowler-Nordheim tunneling occurs when the potential of the floating gate is great enough to cause the required high-field intensity across thin dielectric layer (100 Angstroms of silicon dioxide) in the vicinity of the drain. Under this condition, electrons are tunneled into or out of the floating gate, causing the potential of the floating gate 9 to change.

Hot-electron injection occurs when electrons achieve a high-enough energy level to migrate across the insulating layer barrier, in region 23 (part of layer 20 near thin layer 19) and 19 onto the floating gate 9. These "hot" electrons are produced when a moderate potential of +6 volts is applied across the drain 6d with respect to the source 6s. A high potential of +12 volts is applied to the control X gate 10, and +2 volts is applied to control Y gate 8 (See FIG. 5 "Program 2").

FIG. 5 shows the condition of applied voltages required for the four operating modes: "ERASE", "PROGRAM 1", "PROGRAM 2" and "READ". Each of the modes will be described seriatim.

"Erase" means the withdrawal of electrons from the floating gate so that the gate is positively charged, causing the threshold voltage of the MOS transistor to be low.

"Program" means the injection of surplus electrons into the floating gate 9 so that the gate is negatively charged, causing the threshold voltage of the MOS transistor to be high.

Fowler-Nordheim tunneling can occur in either direction producing either negative or positive charges in the floating gate 9. These two modes are depicted in FIG. 5, as the ERASE and PROGRAM 1 modes.

PROGRAM 2 describes programming the cell to have a high threshold voltage by hot-electron injection causing the floating gate 9 negatively charged.

Erase

Data is erased when electrons are extracted out of the floating gate 9. Electrons are extracted when a negative voltage, typically −20 volts with respect to the source 6s, and drain 6d is applied to the control Y gate 8, and the control X gate 10 and zero volts applied to source-drain and substrate. The positively charged floating gate 9 then assists the conduction of the channel. Thus, conduction will occur through the channel 7 during read operations.

Program Modes

Information may be programmed into the cell by two distinct program modes, the first, "PROGRAM 1", involving Fowler-Nordheim tunneling, the second, "PROGRAM 2", involving channel hot-electron injection.

Program 1

When information is programmed into the cell using the first mode PROGRAM 1, Fowler-Nordheim tunneling is employed. A positive voltage, typically +20 volts with respect to the source 6s, is applied to the control Y gate 8, and to the control X gate 10. Under these conditions, electrons are tunneled into the floating gate by Fowler-Nordheim tunneling through the thin dielectric oxide 19.

Program 2

By applying +12 volts to the control X gate 10, 2 volts to the control Y gate 8, and 5 volts to the drain 6d, hot electrons are created, some of which electrons have sufficient energy to transit the insulation layer 19 and 23 and are injected into floating gate 9.

Read

When information is desired to be read out from the cell, a positive voltage of, for example, +5 volts, with respect to the source 6s, is applied to both control Y gate 8, and the control X gate 10, and +2 volts to the drain 6d. If the previous condition of the cell was an erase condition, then there would be an electrical current flow from the drain 6d to the source 6s. If the cell is programmed there would be no current from the drain 6d to the source 6s.

Since the presence or absence of current flowing between source 6s and drain 6d indicates whether the floating gate of the cell was charged or discharged. The cell can be said to have "stored" the information that was applied to it.

Process Steps

Figure 7A:
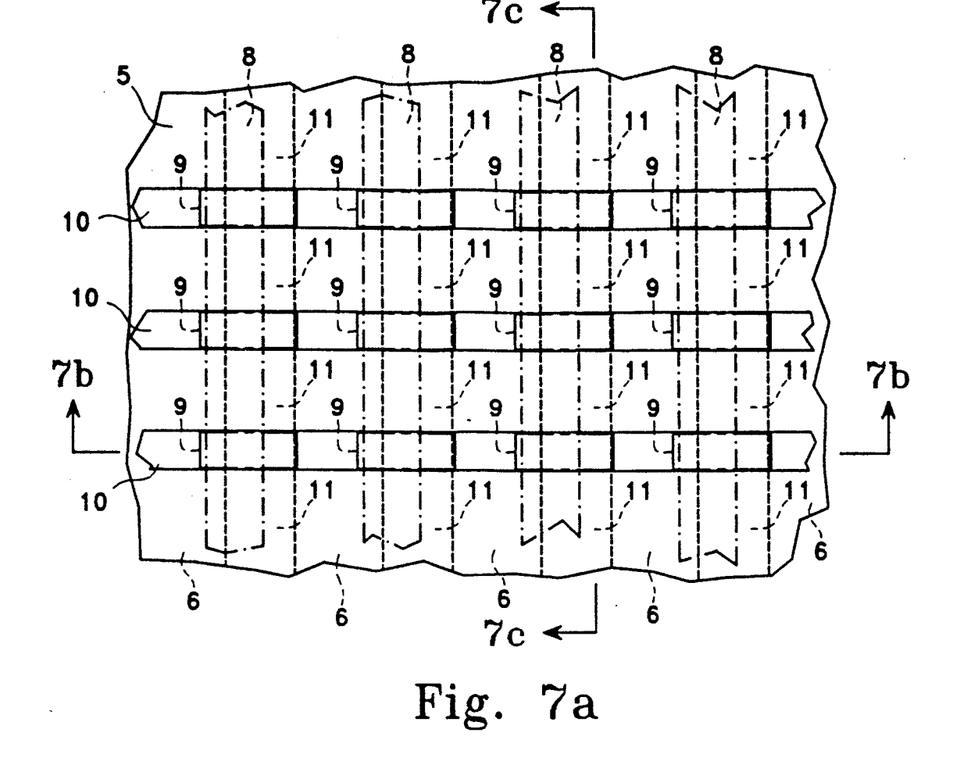
FIG. 7a is a top plan view of the array of FIG. 4, in accordance with the present invention.
Figure 7B:
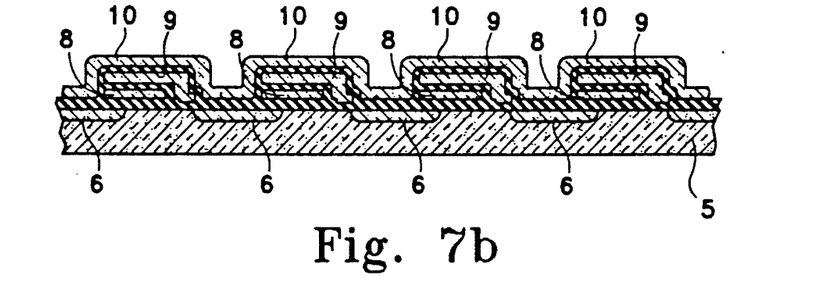
Figure 7C:
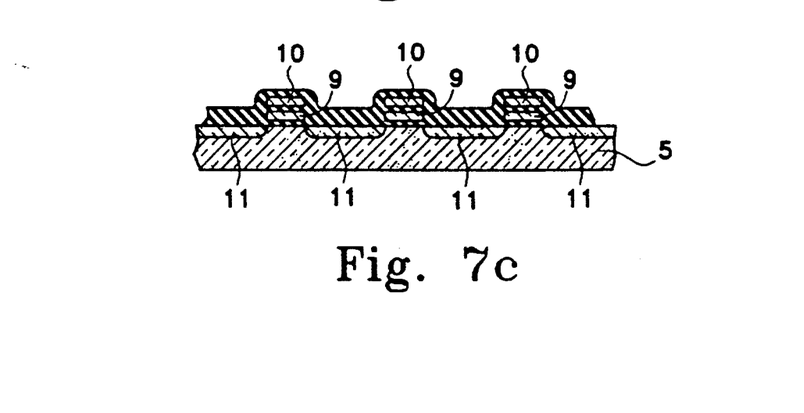

Referring now to FIGS. 7 and 8, a representative set of process steps is shown, by which cells and arrays of cells in accordance with present invention may be fabricated.

FIG. 7a shows in plan view of a completed array, and FIGS. 7b and 7c are cross-sectional views taken along lines 7b—7b and 7c—7c, respectively, of FIG. 7a. Control Y gate 8 of each of the cells are connected together. Similarly, control X gate 10 of each of the cells are connected together. Control Y gate 8 and control X gate 10 are dielectrically separated from each other and in this embodiment, disposed atop the semiconductor substrate 5 perpendicular to each other.

FIG. 8 shows, in sequence, the procedure for fabricating the arrays.

For the example, an N-channel device, is described. However, it will be understood by those skilled in the art, that the principles described can be applied to materials of other polarities.

Figure 8A:
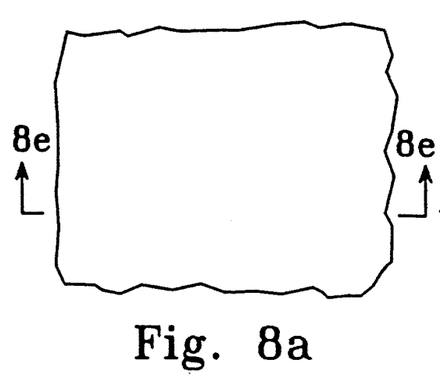
FIGS. 8a–8d are sequential drawings showing the top plan view of the fabrication steps at various stages of the process of the preferred embodiment of the present invention.
Figure 8B:
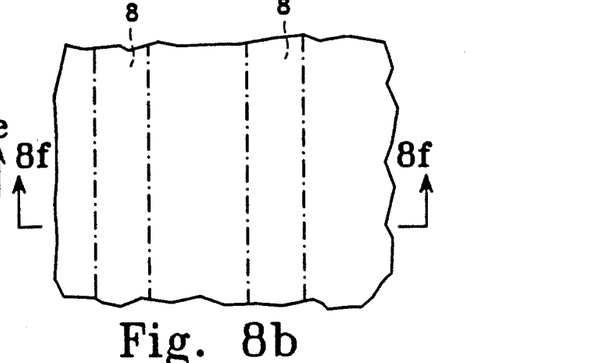
Figure 8C:
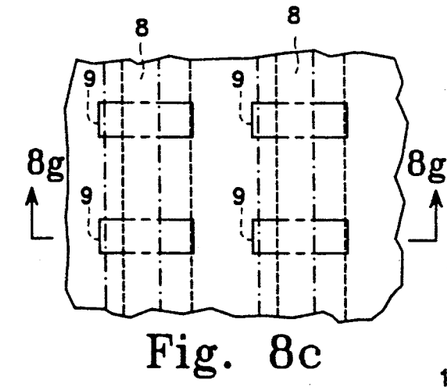
Figure 8D:
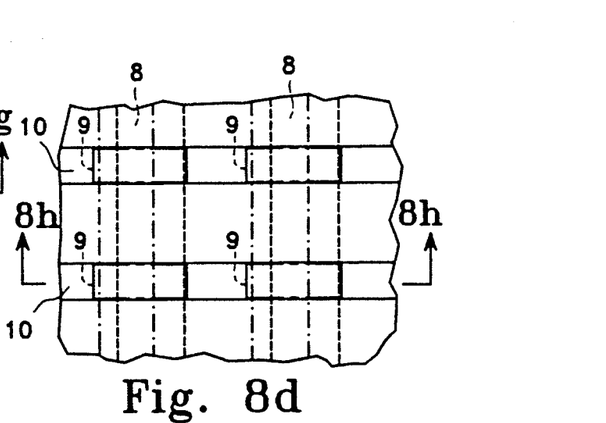
Figure 8E:
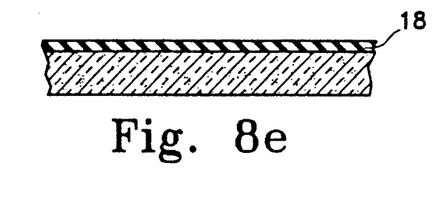
FIGS. 8e–8f are sequential drawings showing the cross-sectional views corresponding to FIGS. 8a–8d, respectively, of the fabrication steps at various stages of the process of the preferred embodiment of the present invention.

In FIGS. 8a and 8e the starting semiconductor material is P-type silicon substrate. A layer of gate insulation oxide is grown approximately 500 Angstroms thick.

Figure 8F:
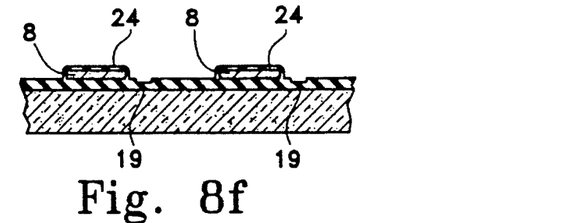
Figure 8G:
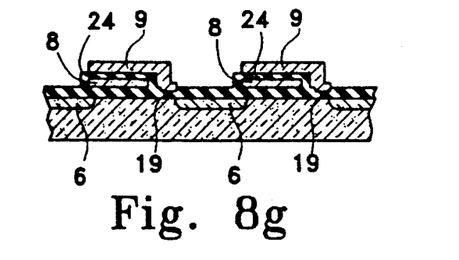
Figure 8H:
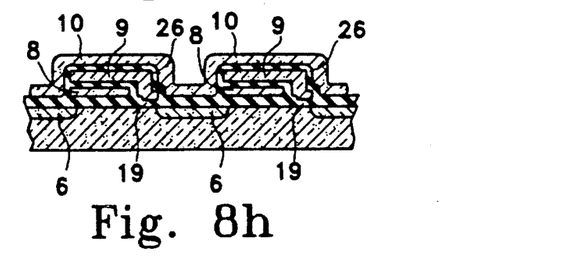

In FIGS. 8b and 8f a first polysilicon deposition layer having a thickness of approximately 4500 Angstroms is deposited on the gate insulation layer 20. The polysilicon is doped to a 4Ω resistance. Then is masked and etched to from the control Y gate 8 shown. An insulation layer 24 is then formed over the control Y gates 8 and the surface of silicon substrate. In the case of EEPROM the tunnel region 19, may then be masked and etched. Approximately 100 Angstroms of tunnel oxide is grown.

Referring now to FIGS. 8c and 8g, the second polysilicon layer is deposited having a thickness of approximately 2500 Angstroms. The second polysilicon layer is then doped, to a 7Ω resistance followed by conventional masking and etching steps to form the floating gate.

The source-drain 6 region is then implanted with arsenic ions to give the region N+ characteristics. An insulation layer 26, such as silicon oxide or oxide-nitride-oxide (ONO) is applied.

In FIGS. 8d and 8h, a third polysilicon and silicide layer, having a total thickness of approximately 4500 Angstroms, is deposited. The layer has a resistance of approximately 4Ω. The layer is then masked and etched to form the control X gate 10.

A self-aligned etching step is then performed to etch off unwanted second polysilicon to form individual floating gate 9 for each memory cell.

Finally, P+ regions 11 are formed by implantation of boron ions in order to isolate adjacent cells from one another. (See FIG. 3, and FIG. 7)

Process steps related to peripheral are well known in the art and circuits are not included here. Steps described above may also be done in a different sequence, because of the requirements of the peripheral circuitry.

Improvements of the Present Invention

The memory cell according to the present invention has clear advantages over the prior art.

The geometry of the present invention is a one transistor geometry, and is "contactless". That is to say, not every cell requires a physical electrical metallic contact which must be wired to other cells typically by a metalization step. In practical arrays, the use of more than a certain number of cells connected to a diffused bitline becomes unworkable because of resistance in the bitline (which has to connect to the largest number of cells). To lower the bitline resistance, the usual solution is to divide it into segments of, for example, sixteen-bit lengths having contacts in the center of the segment, which contacts are then wired together by low resistance conductors. To make the bitline broader by using higher applied potentials is another approach to reducing bitline resistance, but at a certain point, this becomes impractical due to the interference with adjacent cells which this entails.

However, the control Y gate 8 of the present invention allows the bitline to become wider whenever voltage is applied to the control Y gate 8, thereby reducing the bitline resistance and effectively allowing more cells to be connected by the diffused bitline.

The coupling ratio of the floating gate voltage to the control gate voltage is greatly increased over the conventional cell, due to the fact that the floating gate is dielectrically sandwiched between the control X and Y gates 10 and 8.

Instead of being programmable or erasable in blocks or bytes, the present invention can be programmed, erased, or read out down to a single bit level because control X and Y gates, 10 and 8 can select the particular cell to be programmed or erased. The cell selected is the cell under the intersection of the energized control X and Y gates 10 and 8.

Variations of the Preferred Embodiment

Figure 10A:
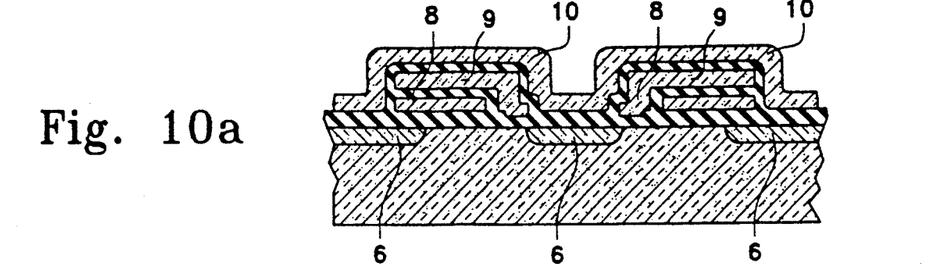
FIG. 10a is a simplified cross-sectional view of the memory cell's arrangement in a cell array in accordance with the present invention, showing a mirror image arrangement of the floating gates of adjacent cells, a variation on the preferred embodiment.
Figure 10B:
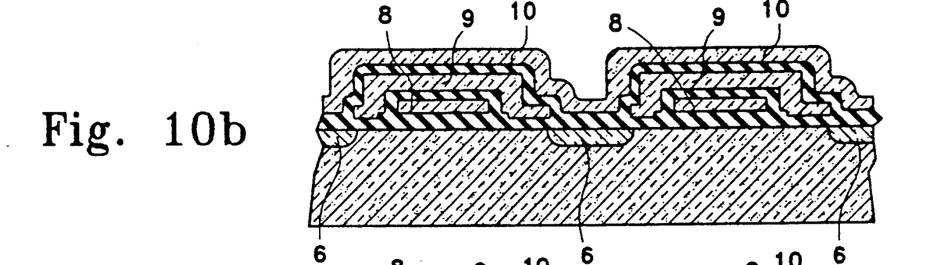
FIG. 10b is a simplified cross-sectional view of the memory cell's arrangement in a cell array in accordance with the present invention, showing a floating gate structure which overlaps the control Y gate, a variation on the preferred embodiment.
Figure 10C:
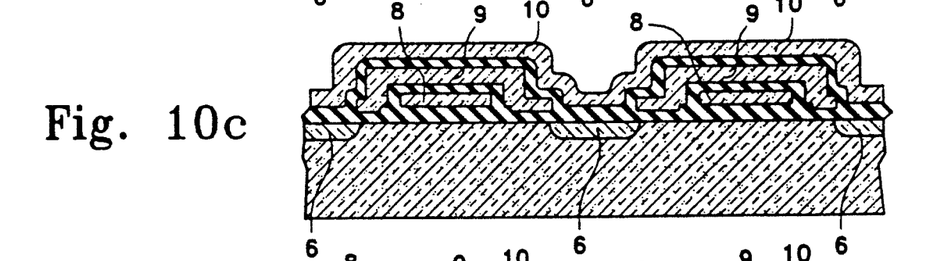
FIG. 10c is a simplified cross-section view of the memory cell's arrangement in a cell array in accordance with the present invention, showing a mirror image arrangement of a floating gate like that of FIG. 10b.
Figure 10D:
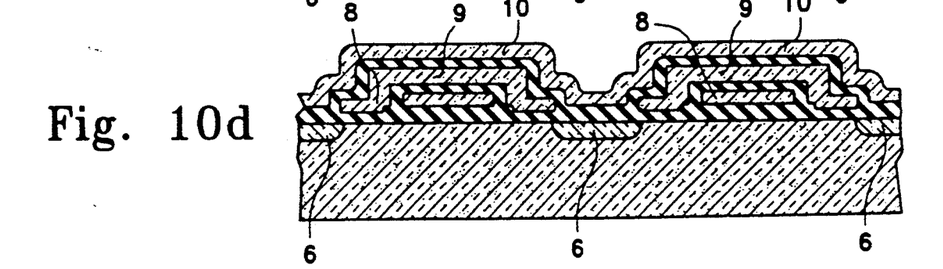
FIG. 10d is a simplified cross-sectional view of the memory cell's arrangement in a cell array in accordance with the present invention, showing an arrangement in which the floating gate surrounds and the control gate and the cells are mirror-images of one another, symmetrical about the control Y gate.

In FIGS. 10a to 10c, embodiments of the present invention are depicted. In FIG. 10a, the floating gates are arranged as mirror-images of one another. In FIG. 10b, the floating gate 9 surrounds the control Y gate 8. In FIG. 10c, the cells of FIG. 10b are arranged as mirror-images. The floating gate is symmetrical with respect to the source, as in FIG. 10a and the floating gate surrounds the control Y gate 8 as in FIG. 10b. In FIG. 10d, the floating gate 9 surrounds and is symmetrical to control Y gate 8, and the cells are arranged as mirror images with respect to one another. These and other arrangements of the elements of the cell are useful in some applications.

Although particular embodiments have been described, it will be appreciated by those skilled in the art that the present invention is not limited merely to those embodiments shown. Many variations and modifications can be made without departure from the spirit of the present invention. For example the materials, the particular shapes, and the arrangement of the gates 8, 9, and 10 can be changed from those which are specifically illustrated. Moreover, the semiconductor materials may be formed of opposite materials (P-type substituted for N-type, and vice versa) when a different polarity device is desired. Accordingly, the preferred form and particularity of the present invention as described may be undertaken without departure from the scope of the invention which is defined only by the claims which follow.

What is claimed is:

1. A non-volatile, electrically programmable and erasable, read-only memory cell formed on a surface of and within a semiconductor substrate, comprising:
   a first source-drain region formed in the substrate adjacent to the surface;
   a second source-drain region formed in the substrate adjacent to the surface, spaced apart from the first source-drain region and thereby defining a channel region between said first and second source-drain regions;
   a first control gate, isolated from and overlying at least a portion of the channel region;
   a floating gate isolated from and overlying at least a portion of the channel region and at least a portion of the first control gate; and
   a second control gate, dielectrically isolated from the first control gate and the floating gate, and overlying at least a portion of the floating gate and the source-drain regions.

2. A non-volatile, electrically programmable and erasable, read-only memory cell formed on a surface of and within a semiconductor substrate, comprising:
   a first source-drain region formed in the substrate adjacent to the surface;
   a second source-drain region formed in the substrate adjacent to the surface;
   a channel region in the substrate adjacent to the surface and disposed between said first and second source-drain regions;
   a first insulating layer formed on the surface of the substrate, and overlying at least a portion of each of the first and second source-drain regions and the channel region, said first insulating layer includes a thinner, generally uniform thickness region in the vicinity of one of the source-drain regions;
   a first control gate formed on said first insulating layer, said first control gate overlying at least a portion of the channel region and at least a portion of said first source-drain region;
   a second insulating layer formed on and overlying at least a portion of the first control gate and at least a portion of the substrate;
   a floating gate formed on the second insulating layer and overlying at least a portion of the channel region and the first control gate and the thinner region of the first insulating layer;
   a third insulating layer formed on said floating gate and the source-drain regions; and
   a second control gate formed on the third insulating layer overlying at least a portion of the floating gate and the source-drain regions, said second control gate being dielectrically isolated from said first control gate.

3. A non-volatile, electrically programmable and erasable, read-only memory cell array comprising:
   a semiconductor substrate of a first conductivity type, the semiconductor substrate includes a principal surface;
   a first source-drain region of a second conductivity type formed in the substrate adjacent to the principal surface, said first source-drain region being generally elongated;
   a second source-drain region of the second conductivity type formed in the substrate adjacent to the principal surface, said second source-drain region being generally elongated and generally parallel to the first source-drain region;
   a plurality of isolation regions of the first conductivity type formed in the semiconductor substrate adjacent to the principal surface, and disposed between said elongated first and second source-drain regions, said plurality of isolation regions defining a plurality of channel regions therebetween;
   a plurality of first control gates corresponding one-for-one with each of the channels regions, electrically isolated and overlying at least a portion of the channel region, at least a portion of said first control gate being adjacent to the first source-drain region;
   an insulating layer formed atop the principal surface of the semiconductor substrate, said insulating layer includes a plurality of thinner, generally uniform thickness regions in the vicinity of each of one of said source-drain regions;
   a plurality of floating gates formed atop the insulating layer and each of said floating gates overlying at least a portion of each of the corresponding channel regions and each of the corresponding first control gates and each of the corresponding thinner regions of the insulating layer; and
   a plurality of second control gates corresponding one-for-one to the plurality of floating gates, each of said second control gates being dielectrically isolated from each of the corresponding said first control gates and overlying at least a portion of the corresponding floating gate.

4. A non-volatile memory cell formed in a semiconductor substrate comprising:
   a first control gate dielectrically isolated from and overlying the semiconductor substrate;
   a floating gate dielectrically isolated from and overlying at least a portion of the first control gate; and
   a second control gate, dielectrically isolated from the first control gate and the floating gate, and overlying at least a portion of the floating gate;
   wherein said first and second control gates are elongated in shape and disposed atop the semiconductor substrate substantially perpendicular to each other.

5. The non-volatile memory cell as set forth in claim 4 further comprising a first source-drain and a second source-drain region, said source-drain regions being formed in the semiconductor substrate in a spaced apart relationship defining a channel region therebetween, wherein said first control gate being disposed atop and dielectrically isolated from at least a portion of said channel region, and wherein said second control gate being disposed atop and dielectrically isolated from portions of said source-drain regions.

6. The non-volatile memory cell as set forth in claim 4 wherein said first and second control gate and said floating gate comprise polysilicon.

7. The non-volatile memory cell as set forth in claim 4 wherein the programming of the memory cell is conducted under the hot electron injection effect, and wherein the erasure of the memory cell is conducted under the Fowler-Nordheim tunneling effect.

8. The non-volatile memory cell as set forth in claim 4 wherein the programming and erasure of the memory cell are conducted under the Fowler-Nordheim tunneling effect.

9. A non-volatile memory array including a plurality of memory cells formed in a semiconductor substrate, each of the memory cell comprising:

a first source-drain region formed in the semiconductor substrate;

a second source-drain region formed in the semiconductor substrate and spaced from said first source-drain region, said first and second source-drain regions defining a channel region therebetween;

a first control gate dielectrically isolated from and overlying at least a portion of said channel region;

a floating gate dielectrically isolated from and overlying at least a portion of the channel region and at least a portion of said first control gate; and a second control gate, dielectrically isolated from said first control gate and said floating gate, and overlying at least a portion of said floating gate;

wherein the plurality of memory cells are arranged in a matrix of rows and columns in the semiconductor substrate, with the first control gates in each of said columns being electrically connected together, and with the second control gates in each of said rows being electrically connected together.

* * * * *